United States Patent
Hsu et al.

(10) Patent No.: US 9,733,269 B2
(45) Date of Patent: Aug. 15, 2017

(54) MICRO-ELECTRO-MECHANICAL SYSTEM (MEMS) DEVICE WITH MULTI-DIMENSIONAL SPRING STRUCTURE AND FRAME

(71) Applicants: Yu-Wen Hsu, Tainan (TW); Shih-Chieh Lin, Kaohsiung (TW); Chia-Yu Wu, Kaohsiung (TW)

(72) Inventors: Yu-Wen Hsu, Tainan (TW); Shih-Chieh Lin, Kaohsiung (TW); Chia-Yu Wu, Kaohsiung (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 329 days.

(21) Appl. No.: 14/535,022

(22) Filed: Nov. 6, 2014

(65) Prior Publication Data
US 2016/0131679 A1    May 12, 2016

(51) Int. Cl.
*G01P 15/125* (2006.01)
*H01L 29/84* (2006.01)
*G01P 15/08* (2006.01)

(52) U.S. Cl.
CPC .... *G01P 15/125* (2013.01); *G01P 2015/0845* (2013.01); *H01L 29/84* (2013.01)

(58) Field of Classification Search
CPC . G01P 15/125; G01P 2015/0845; H01L 29/84
USPC .......... 73/504.12, 514.32; 257/415
See application file for complete search history.

(56) References Cited

U.S. PATENT DOCUMENTS

| | | | |
|---|---|---|---|
| 7,134,340 B2 | 11/2006 | Samuels et al. | |
| 7,637,160 B2 | 12/2009 | Koury, Jr. et al. | |
| 8,459,114 B2 | 6/2013 | Hsu et al. | |
| 9,242,851 B2* | 1/2016 | Geisberger | B81B 3/0027 |
| 9,360,496 B2* | 6/2016 | Naumann | G01P 15/18 |
| 2005/0005698 A1* | 1/2005 | McNeil | G01P 15/18 73/514.32 |
| 2006/0207328 A1* | 9/2006 | Zarabadi | G01P 15/18 73/514.32 |
| 2006/0272411 A1* | 12/2006 | Acar | G01C 19/5712 73/504.04 |
| 2007/0034007 A1* | 2/2007 | Acar | G01P 15/0888 73/514.01 |
| 2008/0196502 A1* | 8/2008 | Fukuda | G01P 15/08 73/514.38 |

(Continued)

*Primary Examiner* — Lisa Caputo
*Assistant Examiner* — Nathaniel T Woodward
(74) *Attorney, Agent, or Firm* — Tung & Associates

(57) ABSTRACT

The invention provides a MEMS device. The MEMS device includes: a substrate; a proof mass, including at least two slots, each of the slots including an inner space and an opening, the inner space being relatively closer to a center area of the proof mass than the opening; at least two anchors located in the corresponding slots and connected to the substrate; at least two linkages located in the corresponding slots and connected to the corresponding anchors; and a multi-dimensional spring structure for assisting a multi-dimensional movement of the proof mass, the multi-dimensional spring structure surrounding a periphery of the proof mass, and connected to the substrate through the linkages and the anchors. The multi-dimensional spring structure includes first and second springs for assisting an out-of-plane movement and an in-plane movement of the proof mass.

10 Claims, 7 Drawing Sheets

(56) References Cited

U.S. PATENT DOCUMENTS

| | | | |
|---|---|---|---|
| 2010/0122579 A1* | 5/2010 | Hsu .................. | G01P 15/125 |
| | | | 73/514.32 |
| 2010/0281980 A1* | 11/2010 | Yazawa ............... | B81B 3/0078 |
| | | | 73/514.32 |
| 2011/0023604 A1* | 2/2011 | Cazzaniga ......... | G01C 19/5712 |
| | | | 73/514.32 |
| 2011/0197677 A1* | 8/2011 | Nasiri ................ | G01P 15/0802 |
| | | | 73/514.02 |
| 2012/0000287 A1* | 1/2012 | Frangi ................ | G01P 15/18 |
| | | | 73/514.32 |
| 2013/0214367 A1* | 8/2013 | van der Heide ..... | H01L 29/84 |
| | | | 257/415 |
| 2014/0090469 A1* | 4/2014 | Comi .................. | G01P 15/097 |
| | | | 73/504.12 |

\* cited by examiner

MICRO-ELECTRO-MECHANICAL SYSTEM (MEMS) DEVICE WITH MULTI-DIMENSIONAL SPRING STRUCTURE AND FRAME

BACKGROUND OF THE INVENTION

Field of Invention

The present invention relates to a micro-electro-mechanical system (MEMS) device, especially a MEMS device which includes a proof mass and a multi-dimensional spring structure connected to one or more anchors in a center area of the proof mass, for assisting a multi-dimensional movement of the proof mass.

Description of Related Art

MEMS devices are well-known devices nowadays, and one common application of the MEMS devices is to sense movements. FIG. 1 shows a prior art MEMS device 10 according to U.S. Pat. No. 8,459,114, wherein three proof masses 11, 12, and 13 are provided for three-dimensional movement sensing. The proof masses 11, 12, and 13 have different mass amounts and sizes, and therefore each dimension requires a different design to sense the movement; as a result, the overall structure is complicated. The anchors connecting the proof masses 11, 12, and 13 to a fixed end 14 are not all at a center area of the MEMS device 10; hence, stress resulting from the temperature variation in the manufacturing process or in the operation may cause a distortion of the structure to reduce accuracy of the MEMS device 10.

FIG. 2 shows another prior art MEMS device 20 according to U.S. Pat. No. 7,637,160. The proof mass 21 of the MEMS device 20 is connected to a substrate 23 by anchors 22 at two sides in the Y-direction. The MEMS device 20 is only capable of sensing in-plane movements (in X and Y directions, FIG. 2) parallel to the substrate 23. The MEMS device 20 can not sense a three-dimensional movement, and a distortion may still happen.

FIG. 3 shows another prior art MEMS device 30 according to U.S. Pat. No. 7,134,340 (the MEMS device 30 has a symmetrical structure and FIG. 3 shows a one-fourth partial view of the MEMS device 30). The proof mass 31 of the MEMS device 30 is connected to a substrate (no shown) through a linkage 32, a spring 33, and anchors 34. The linkage 32 is connected to the substrate through multiple anchors 34, in order to avoid deformation or distortion. The layout design to some extent reduces the problem of deformation or distortion, but it limits the movement of the proof mass 31 to a two-dimensional movement and increases the complexity of the manufacturing process.

In view of the above, the prior art MEMS devices either can not sense a three-dimensional movement, or can not sustain a large stress to cause a large offset. For solving the defects of the prior art, the present invention provides a MEMS device capable of sensing a multi-dimensional movement while having a small offset under a large stress.

SUMMARY OF THE INVENTION

According to a perspective of the present invention, a MEMS device is provided. The MEMS device includes: a substrate; a proof mass, a proof mass, including at least two slots, each of the slots including a first inner space and an opening, wherein the first inner space is relatively closer to a center area of the proof mass than the opening; at least two anchors, respectively located in the corresponding slots and connected to the substrate; at least two linkages, respectively located in the corresponding slots and connected to the corresponding anchors; and a multi-dimensional spring structure for assisting a multi-dimensional movement of the proof mass, the multi-dimensional spring structure surrounding a periphery of the proof mass, and connected to the substrate through the linkages and the anchors, the multi-dimensional spring structure comprising: a plurality of first springs, connected to the proof mass for assisting an out-of-plane movement of the proof mass; and a plurality of second springs, each of the second springs being directly or indirectly connected between a corresponding one of the linkages and a corresponding one of the first springs, for assisting an in-plane movement of the proof mass.

In one embodiment, the at least two slots, the at least two linkages, and the at least two anchors are respectively symmetrically disposed.

In one embodiment, the first springs are connected to two opposite sides of the proof mass, and the openings of the at least two slots are connected to two other opposite sides of the proof mass.

In one embodiment, the first springs are connected to two opposite sides of the proof mass, and the openings of the at least two slots are connected to two other opposite sides of the proof mass.

In one embodiment, a rotation axis is formed along an imaginary line connecting two of the first springs, and a mass of the proof mass is unevenly distributed at two sides of the rotation axis such that the rotational movement is an eccentric movement.

In one embodiment, the first springs are translational springs for assisting the out-of-plane movement of the proof mass, and the out-of-plane movement is a translational out-of-plane movement.

In one embodiment, more than one of the anchors are located in each of the slots, and the linkage in each of the slots is connected to all the anchors in the same slot.

In one embodiment, the multi-dimensional movement is a three-dimensional movement.

In one embodiment, the multi-dimensional spring structure includes: an outer frame, including a second inner space for accommodating the proof mass; at least two inner beams, respectively connected to the at least two corresponding linkages; and the first springs and the second springs, wherein the outer frame is connected to the inner beams through the second springs, and the outer frame is connected to the proof mass through the first springs, and wherein there is no portion of the proof mass between the inner beams and the outer frame.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, to show the interrelations between the components or structural parts, but not drawn according to actual scale.

Figure 1:
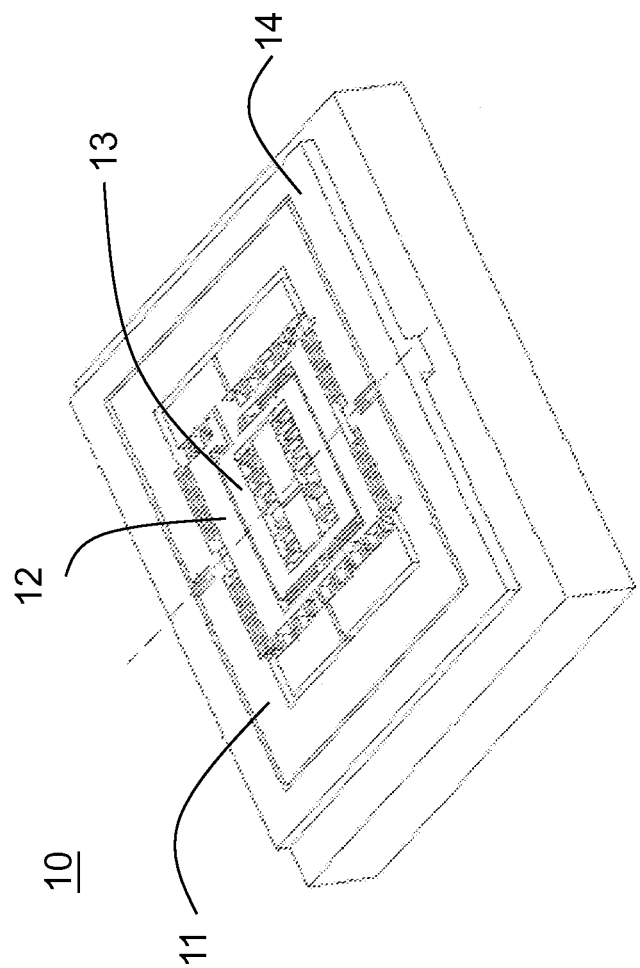
FIGS. 1, 2, and 3 respectively show three prior art MEMS devices.
Figure 2:
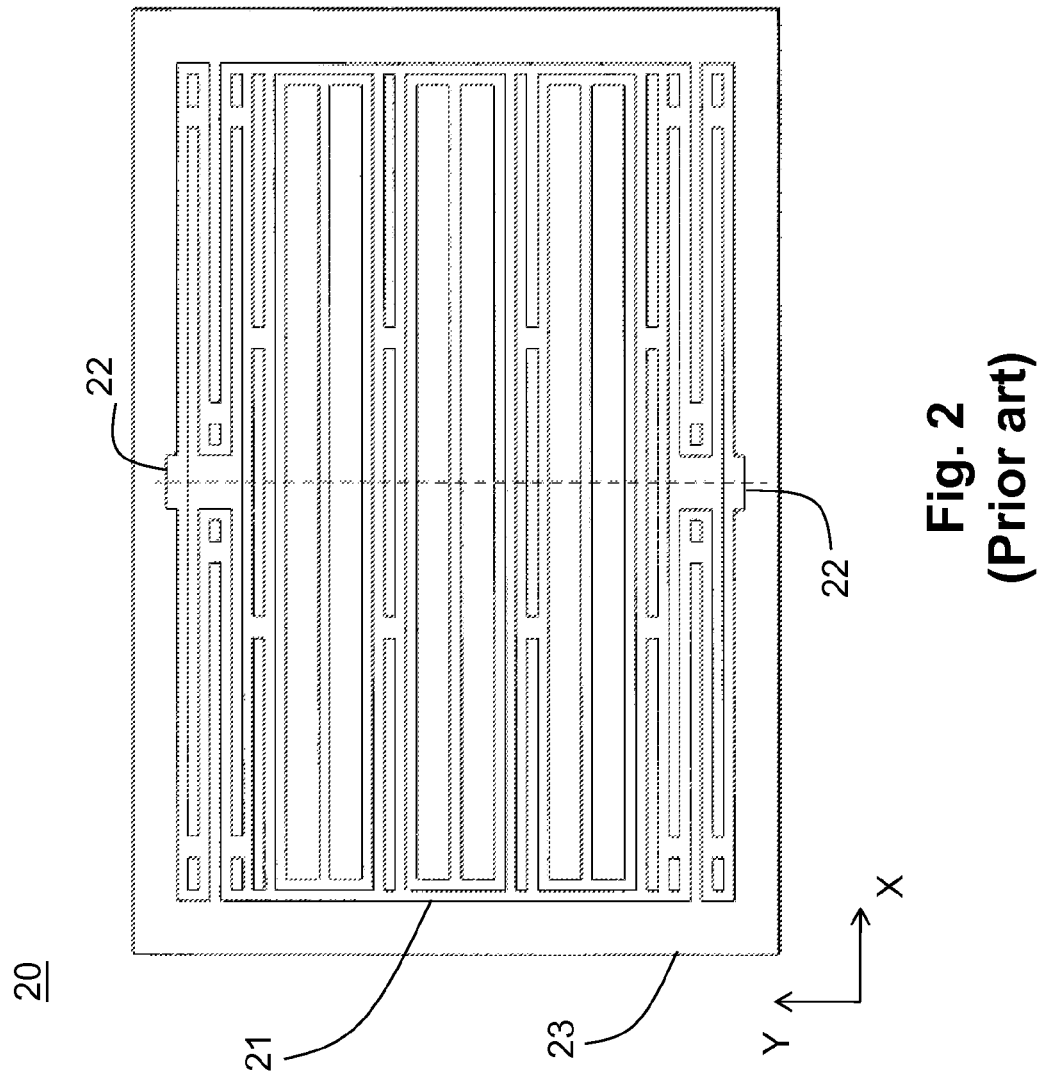
Figure 3:
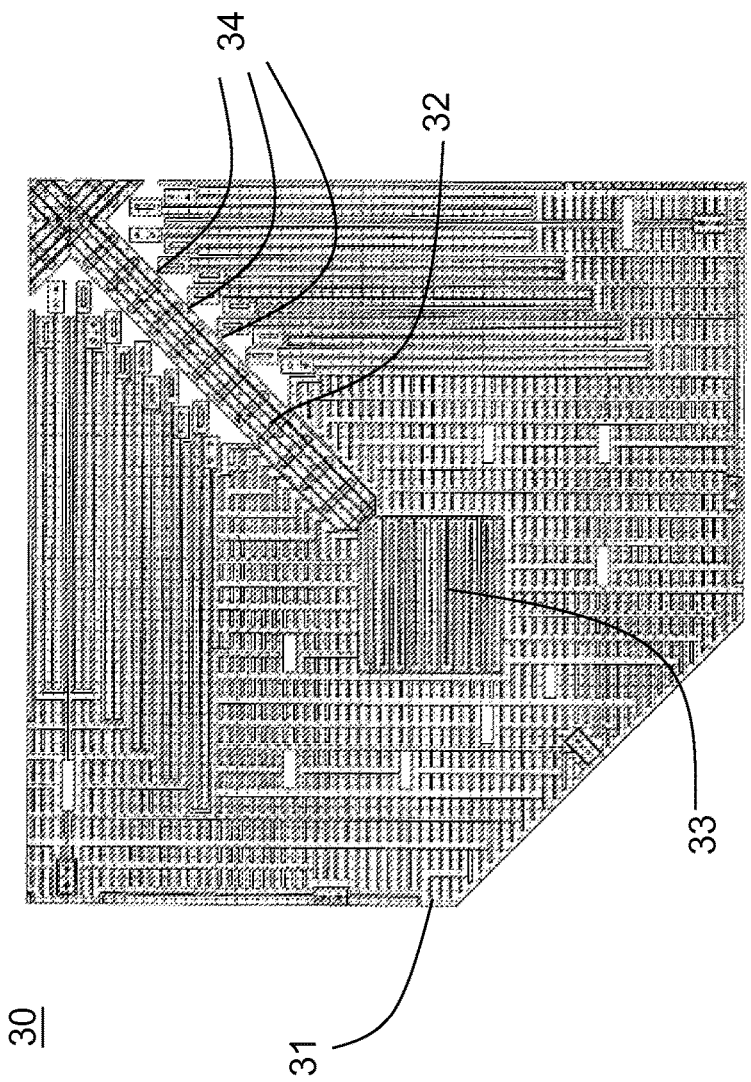
Figure 4A:
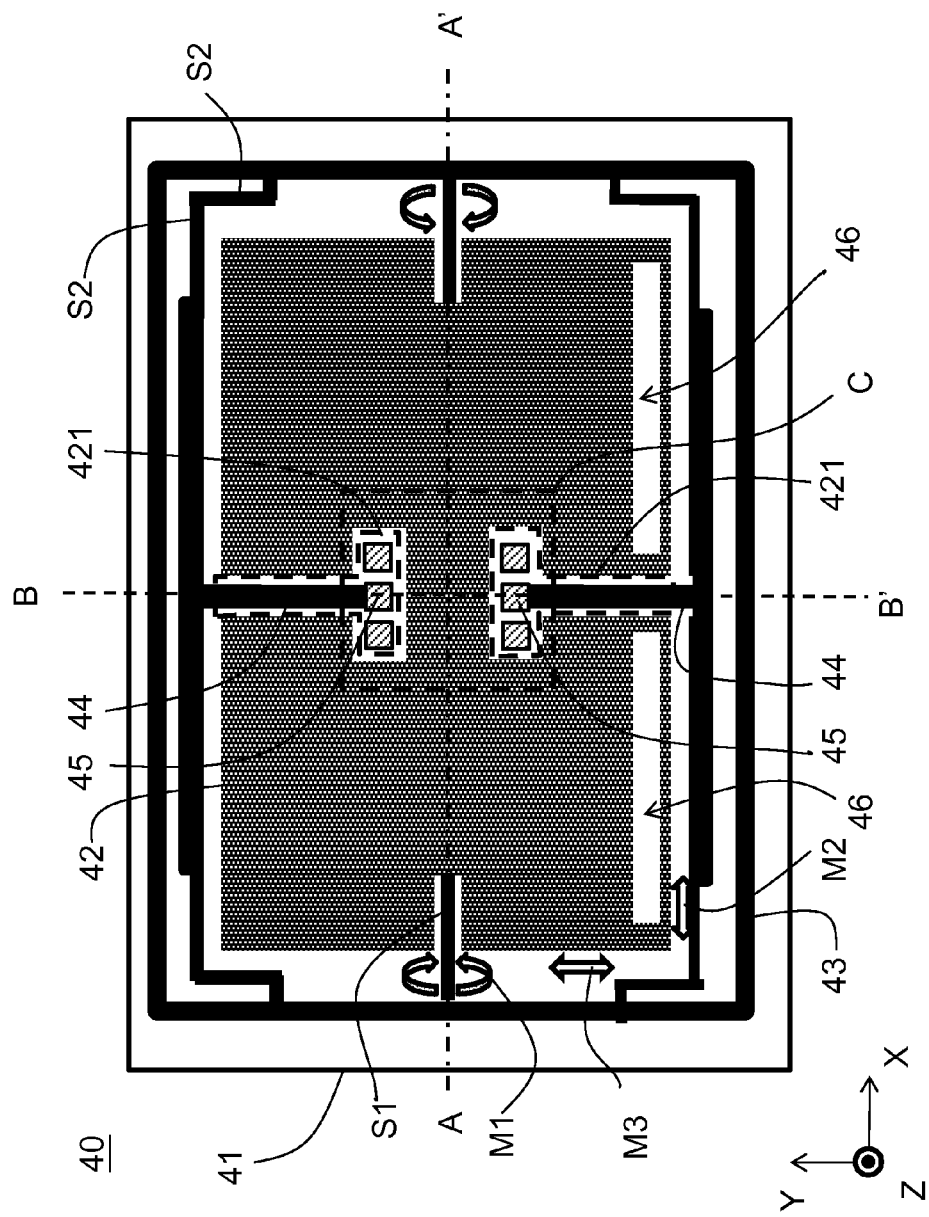
FIG. 4A shows a MEMS device according to one embodiment of the present invention.
Figure 4C:
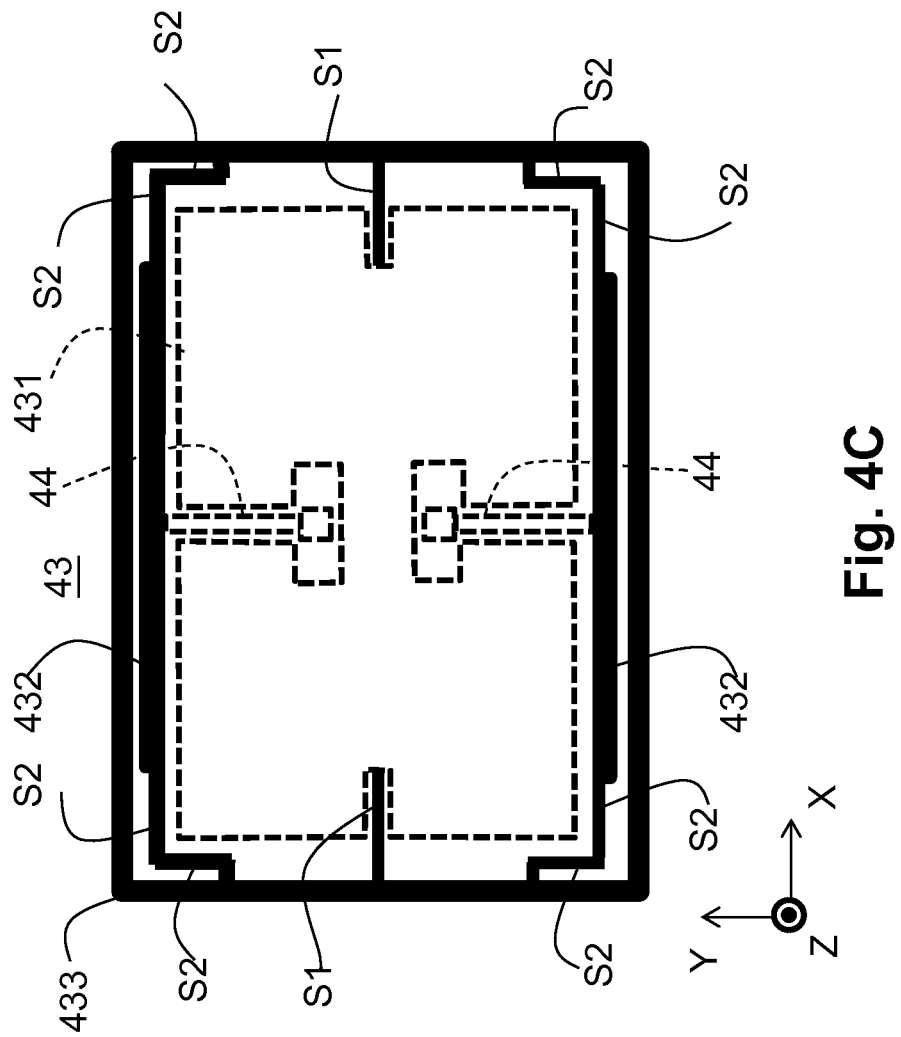
FIG. 4C shows a multi-dimensional spring structure according to one embodiment of the present invention.
Figure 4B:
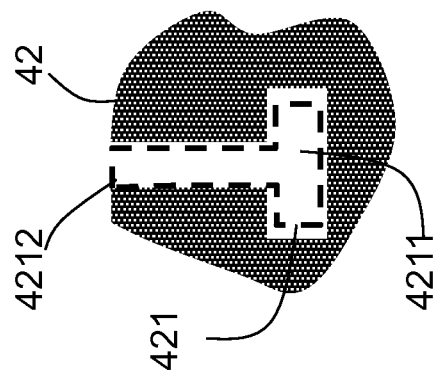
FIG. 4B shows a partial view according to FIG. 4A.

Referring to FIGS. 4A-4C, which show a MEMS device 40 according to one perspective of the present invention. The MEMS device 40 includes: a substrate 41; a proof mass 42, including at least two slots 421, each of the slots 421 including an inner space 4211 and an opening 4212 (as shown in FIG. 4B which is a partial view of FIG. 4A), wherein the inner space 4212 is relatively closer to a center area C (as shown in FIG. 4A) of the proof mass 42 than the opening 4212; at least two linkages 44 and at least two anchors 45, wherein each linkage is connected to at least one corresponding anchor 45, and each connected set of linkage 44 and anchor 45 is located in a corresponding slot; and a multi-dimensional spring structure 43 (referring to FIG. 4C, wherein the multi-dimensional spring structure 43 is shown by the solid lines while the other structural parts are shown by the dashed lines) for assisting a multi-dimensional movement of the proof mass 42, the multi-dimensional spring structure 43 surrounding a periphery of the proof mass 42, and being connected to the substrate 41 through the linkages 44 and the anchors 45. (In the example shown in FIG. 4A, plural anchors 45 are shown in each slot 412; each linkage 44 can be connected to any number of anchors 45 in the same slot 421, such as but not limited to all the anchors 45). The multi-dimensional spring structure 42 includes plural first springs S1 connected to the proof mass 42, for assisting an out-of-plane movement of the proof mass 42 (for example, a rotational elastic movement M1 as shown in FIG. 4A). The multi-dimensional spring structure 42 further includes plural second springs S2 for assisting an in-plane movement (for example, translational elastic movements M2 and M3 as shown in FIG. 4A) of the proof mass 42. Each of the second springs is directly or indirectly connected between a corresponding linkage 44 and a corresponding first spring S1. In one embodiment, the at least two slots 421, the at least two linkages 44, and the at least two anchors 45 are respectively symmetrically disposed. In one embodiment, the first springs S1 are connected to two opposite sides of the proof mass 42, and the openings 4214 of the at least two slots 421 are connected to (or provided at) two other opposite sides of the proof mass 42.

The proof mass 42 forms at least one movable electrode, and at least one fixed electrode is provided at a corresponding position in the MEMS device 40. When the proof mass 42 moves, the capacitance between the movable electrode and the fixed electrode changes whereby the movement of the MEMS device 40 can be sensed. The capacitive movement sensing is known by one skilled in the art, so relevant details are omitted herein. The position of the fixed electrode can be arranged as required.

In one embodiment, the proof mass 42 in the MEMS device 40 is a single mass body; however, the number of the mass bodies can be more than one. For example, the proof mass 42 can include two or more mass bodies (not shown) which are not directed connected to one another, wherein and each mass body is for sensing the movement in a different direction.

Please refer to FIG. 4A, in one embodiment, the multi-directional movement of the proof mass 42 is an eccentric movement. With respect to an axis AA' formed along an imaginary connection line connecting the first springs, the mass of the proof mass 42 is unevenly distributed at the two side of the axis AA', and therefore a rotational movement of the proof mass 42 with respect to the axis AA' is an eccentric movement. The uneven mass distribution of the proof mass 42 can be achieved by various ways. In one embodiment, the axis AA' can be located away from a geometric center line of the proof mass 42. In another embodiment, the uneven mass distribution of the proof mass 42 can be achieved by providing at least one trench 46 in the proof mass 42. The trenches 46 as shown in FIG. 4A are for illustrative purpose only; the number, shapes, or positions of the trenches 46 can be changed. Due to the uneven mass distribution of the proof mass 42 with respect to the axis AA', the in-plane movement of the proof mass 42 along the direction X in the X-Y plane is also an eccentric movement.

In one embodiment, the mass of the proof mass 42 can be designed to be unevenly distributed at two sides of an axis BB', so that the in-plane movement (in the X-Y plane) of the proof mass 42 along the direction Y can also be an eccentric movement.

The uneven mass distribution to cause an eccentric movement can improve the sensing precision by a differential capacitance measurement; however, the present invention is not limited to this, and the movements of the proof mass 42 in all dimensions can all be merely translational movements instead of eccentric movements.

Figure 5:
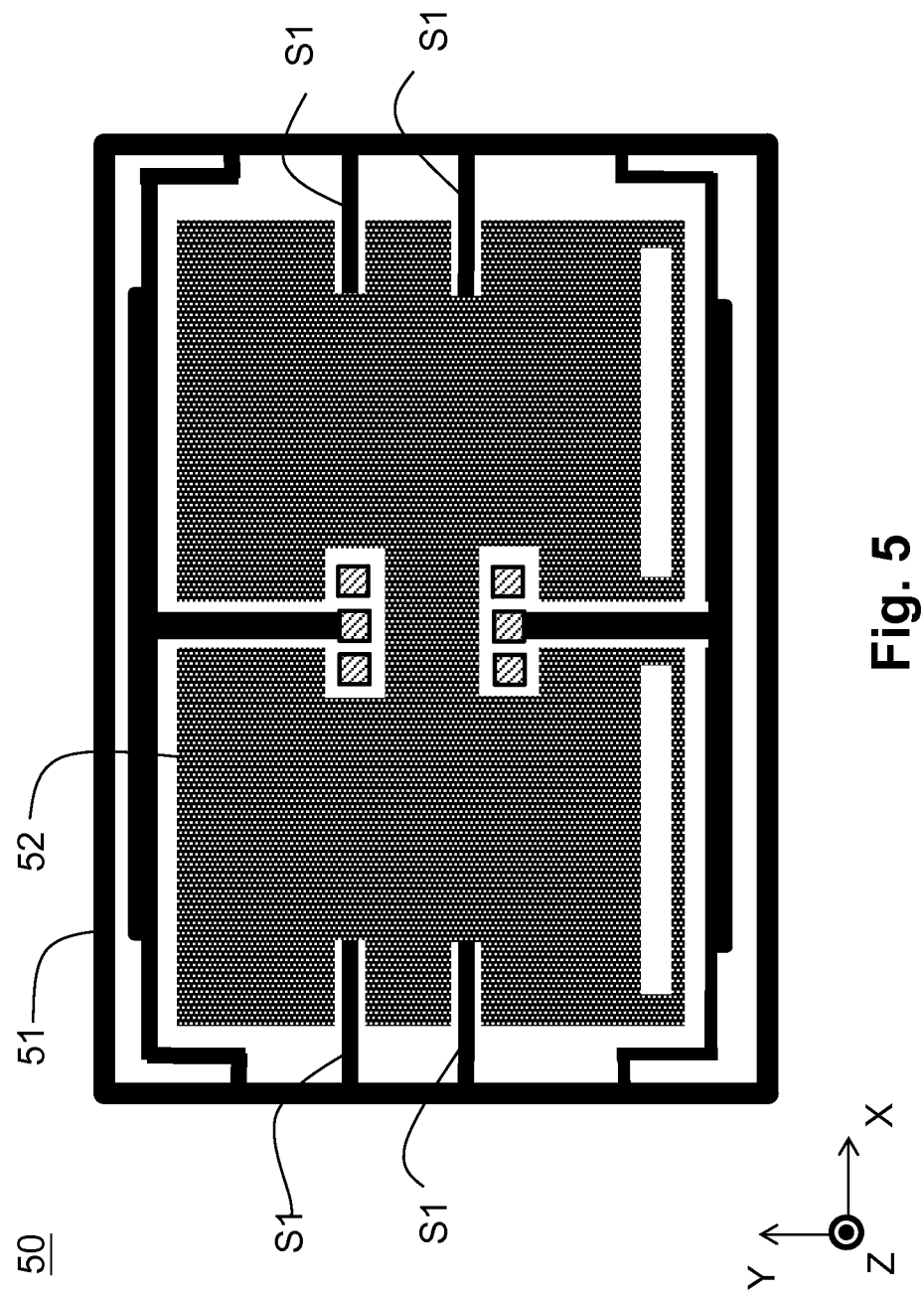
FIGS. 5 and 6 show two MEMS devices according to two embodiments of the present invention, respectively.

For example, FIG. 5 shows a MEMS device 50 according to one embodiment of the present invention, wherein the proof mass 52 can not rotate along the first springs S1, so an out-of-plane movement (the direction Z is the out-of-plane direction with respect to the X-Y plane) of the proof mass is merely a translational movement. To guard against thermal distortion, the two first springs at the right side and the two first springs at the left side are preferably close to the center of the right side and the center of the left side, for example, located in the middle one-third range of the right and the left sides of the proof mass 52. If the thermal distortion problem is even more critical, the first springs can be located in the middle one-fourth range of the right and the left sides of the proof mass 52. However, the scope of the present invention is not limited to the above examples of the ranges.

In the aforementioned embodiments, the multi-dimensional movement is described as a three-dimensional elastic movement. However, the present invention is also applicable to sense two-dimensional elastic movements (for example, one of the fixed electrodes for sensing the X, Y, and Z directions is removed so that one less dimension is sensed), and also applicable to sense movements of more than three dimensions (for example, sensing angular velocity or gravity in addition to the X, Y, and Z dimensions). The dimension number of the multi-dimensional elastic movement can be modified according to practical needs.

The primary functions of the multi-dimensional spring structure 43 is to elastically connect the proof mass 42 for assisting the multi-dimensional movement of the proof mass 42, and connect the proof mass 42 to the anchors 45 in the slots 421 of the proof mass 42. The multi-dimensional spring structure 43 can be designed to have any structure and layout, as long as the multi-dimensional spring structure 43 can provide the aforementioned functions. Please refer to FIGS. 4A and 4C, in one preferable embodiment, the multi-dimensional spring structure 43 has a frame-like structure, and the proof mass 42 is in an inner space 431 of the frame-like structure. In detail, the multi-dimensional spring structure 43 includes: an outer frame 433, including an inner space 431 for accommodating the proof mass 42; at least two inner beams 432, respectively connected to at least two corresponding linkages 44, and the at least two inner beams 432 being connected to a substrate 41 of the MEMS device 40 through the at least two corresponding linkages 44 and at least two corresponding anchors 45, respectively, wherein the anchors 45 are located in the slots 421 in the proof mass 42; and first springs S1 and second springs S2, wherein the outer frame 433 is connected to the inner beams 432 through the second springs S2, and the outer frame 433 is connected to the proof mass 42 through the first springs S1, for assisting a multi-dimensional elastic movement (M1, M2, and M3) of the proof mass 42. Note that there is no portion of the proof mass 42 between the inner beams 432 and the outer frame 433. Thus, the multi-dimensional spring structure 43 has a frame-like structure, and the proof mass 42 is in an inner space 431 of the frame-like structure.

Figure 6:
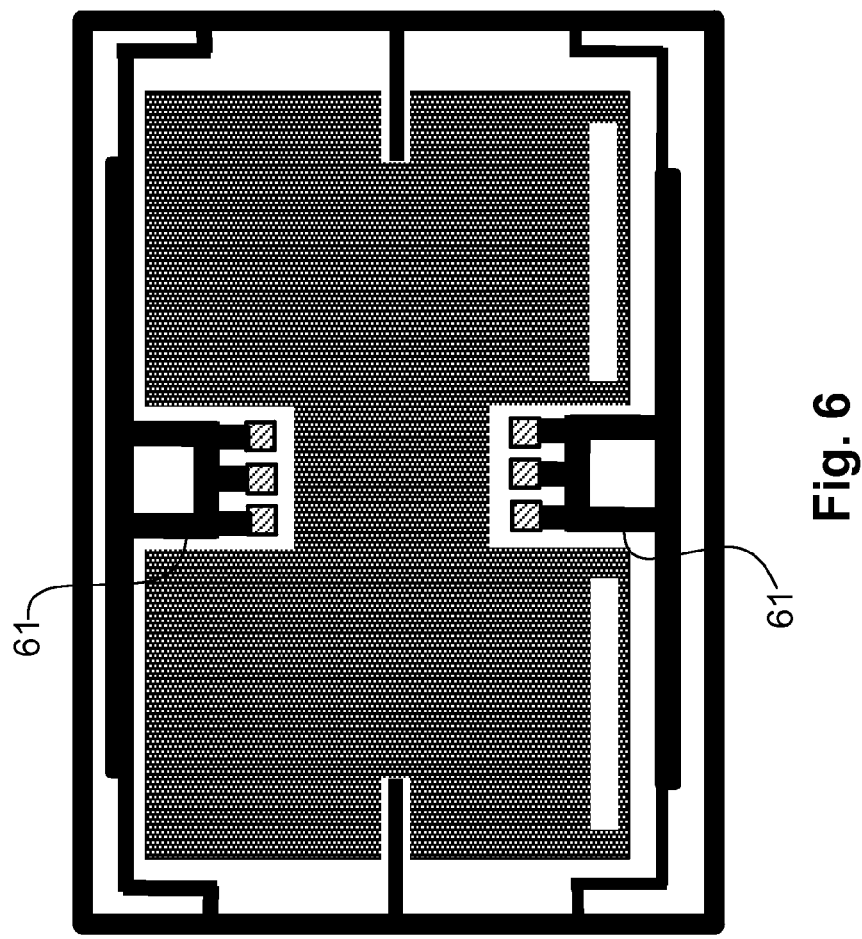

In the embodiments shown in FIGS. 4A, 4C, and 5, the linkages 44 have a square or a straight shape. In another embodiment shown in FIG. 6, the MEMS device 60 includes linkages 61 with a different shape from the aforementioned linkages, which shows that the linkages are not limited to any shape. Besides, the shape of the slots is not limited to the shape shown in FIGS. 4A-4C and 5.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. An embodiment or a claim of the present invention does not need to achieve all the objectives or advantages of the present invention. The title and abstract are provided for assisting searches but not for limiting the scope of the present invention.

What is claimed is:

1. A micro-electro-mechanical system (MEMS) device, comprising:
    a substrate;
    a proof mass, including at least two slots, each of the slots including a first inner space and an opening, wherein the first inner space is relatively closer to a center area of the proof mass than the opening;
    at least two anchors, respectively located in the corresponding first inner spaces and connected to the substrate;
    at least two linkages, respectively located in the corresponding slots and connected to the corresponding anchors; and
    a multi-dimensional spring structure for assisting a multi-dimensional movement of the proof mass, the multi-dimensional spring structure surrounding a periphery of the proof mass, and connected to the substrate through the linkages and the anchors, the multi-dimensional spring structure comprising:
        a plurality of first springs, connected to the proof mass for assisting an out-of-plane movement of the proof mass;
        a plurality of second springs, each of the second springs being directly or indirectly connected between a corresponding one of the linkages and a corresponding one of the first springs, for assisting an in-plane movement of the proof mass, wherein the first springs and second springs respectively assist movements of the proof mass in different dimensions; and
        an outer frame which is connected to the first and second springs and forms a frame-like structure which encompasses all of the proof mass, wherein the second springs are connected to the proof mass through the first springs.

2. The MEMS devices of claim 1, wherein the at least two slots, the at least two linkages, and the at least two anchors are reflection-symmetric with respect to a center line of the proof mass, respectively.

3. The MEMS devices of claim 1, wherein the first springs are connected to two opposite sides of the proof mass, and the openings of the at least two slots are connected to two other opposite sides of the proof mass.

4. The MEMS devices of claim 1, wherein the first springs are rotatable springs for assisting an out-of-plane rotational movement of the proof mass.

5. The MEMS devices of claim 4, wherein a rotation axis is formed along an imaginary line connecting two of the first springs, and a mass of the proof mass is unevenly distributed at two sides of the rotation axis such that the rotational movement is an eccentric movement.

6. The MEMS devices of claim 1, wherein the first springs are translational springs for assisting the out-of-plane movement of the proof mass, and the out-of-plane movement is a translational out-of-plane movement.

7. The MEMS devices of claim 1, wherein more than one of the anchors are located in each of the slots, and the linkage in each of the slots is connected to all the anchors in the same slot.

8. The MEMS devices of claim 1, wherein the multi-dimensional movement is a three-dimensional movement.

9. The MEMS devices of claim 1, wherein the multi-dimensional spring structure includes:
    at least two inner beams, respectively connected to the at least two corresponding linkages; and
    the first springs and the second springs, wherein the outer frame is connected to the inner beams through the second springs, and the outer frame is connected to the proof mass through the first springs, and wherein there is no portion of the proof mass between the inner beams and the outer frame.

10. A micro-electro-mechanical system (MEMS) device, comprising:
    a substrate;
    a proof mass, including at least two slots, each of the slots including a first inner space and an opening, wherein the first inner space is relatively closer to a center area of the proof mass than the opening;
    at least two anchors, respectively located in the corresponding first inner spaces and connected to the substrate;
    at least two linkages, respectively located in the corresponding slots and connected to the corresponding anchors; and
    a multi-dimensional spring structure for assisting a multi-dimensional movement of the proof mass, the multi-dimensional spring structure surrounding a periphery of the proof mass, and connected to the substrate through the linkages and the anchors, the multi-dimensional spring structure comprising:
        a plurality of first springs, connected to the proof mass for assisting an out-of-plane movement of the proof mass; and
        a plurality of second springs, each of the second springs being directly or indirectly connected between a corresponding one of the linkages and a corresponding one of the first springs, for assisting an in-plane movement of the proof mass, wherein the first springs and second springs respectively assist movements of the proof mass in different dimensions;
    wherein the first springs are reflection-symmetric with respect to a first center line of the proof mass and the second springs are reflection-symmetric with respect to a second center line of the proof mass.

* * * * *